(12) United States Patent
Nishi

(10) Patent No.: US 7,551,216 B2
(45) Date of Patent: *Jun. 23, 2009

(54) CCD IMAGING DEVICE AND DRIVING METHOD THEREOF

(75) Inventor: Naoki Nishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 633 days.

This patent is subject to a terminal disclaimer.

(21) Appl. No.: 11/192,635

(22) Filed: Jul. 29, 2005

(65) Prior Publication Data

US 2005/0259171 A1    Nov. 24, 2005

Related U.S. Application Data

(63) Continuation of application No. 10/060,544, filed on Jan. 30, 2002, now Pat. No. 6,970,197.

(30) Foreign Application Priority Data

Feb. 6, 2001    (JP) ............... P2001-029020

(51) Int. Cl.
 *H04N 3/14* (2006.01)
 *H04N 5/335* (2006.01)
(52) U.S. Cl. .............. 348/312; 348/321; 348/323
(58) Field of Classification Search ......... 348/300–304, 348/308, 311, 315–316; 257/246, 250, 251
See application file for complete search history.

(56) References Cited

U.S. PATENT DOCUMENTS

| 4,750,042 | A | 6/1988 | Murayama et al. |
| 6,452,634 | B1 | 9/2002 | Ishigami et al. |
| 6,970,197 | B2 * | 11/2005 | Nishi ............ 348/312 |

FOREIGN PATENT DOCUMENTS

JP    10-191168    7/1998

* cited by examiner

*Primary Examiner*—David L Ometz
*Assistant Examiner*—Kelly L Jerabek
(74) *Attorney, Agent, or Firm*—Sonnenschein Nath & Rosenthal LLP

(57) ABSTRACT

One horizontal CCD register is provided for a plurality of vertical CCD registers. The horizontal CCD register has horizontal transfer electrodes in such a manner that transfer electrodes that are provided for each pair of vertical CCD registers adjacent to each other are independent of each other electrically. The eight transfer electrodes are supplied with eight kinds of horizontal transfer pulse signals, respectively. An operation that the horizontal CCD register consecutively outputs consecutive signal charges in the same manner as in the conventional two-phase driving method and an operation that the horizontal CCD register outputs consecutive signal charges while mixing desired ones are performed selectively by controlling the eight kinds of horizontal transfer pulse signals properly.

14 Claims, 9 Drawing Sheets

PRIOR ART  FIG. 1A
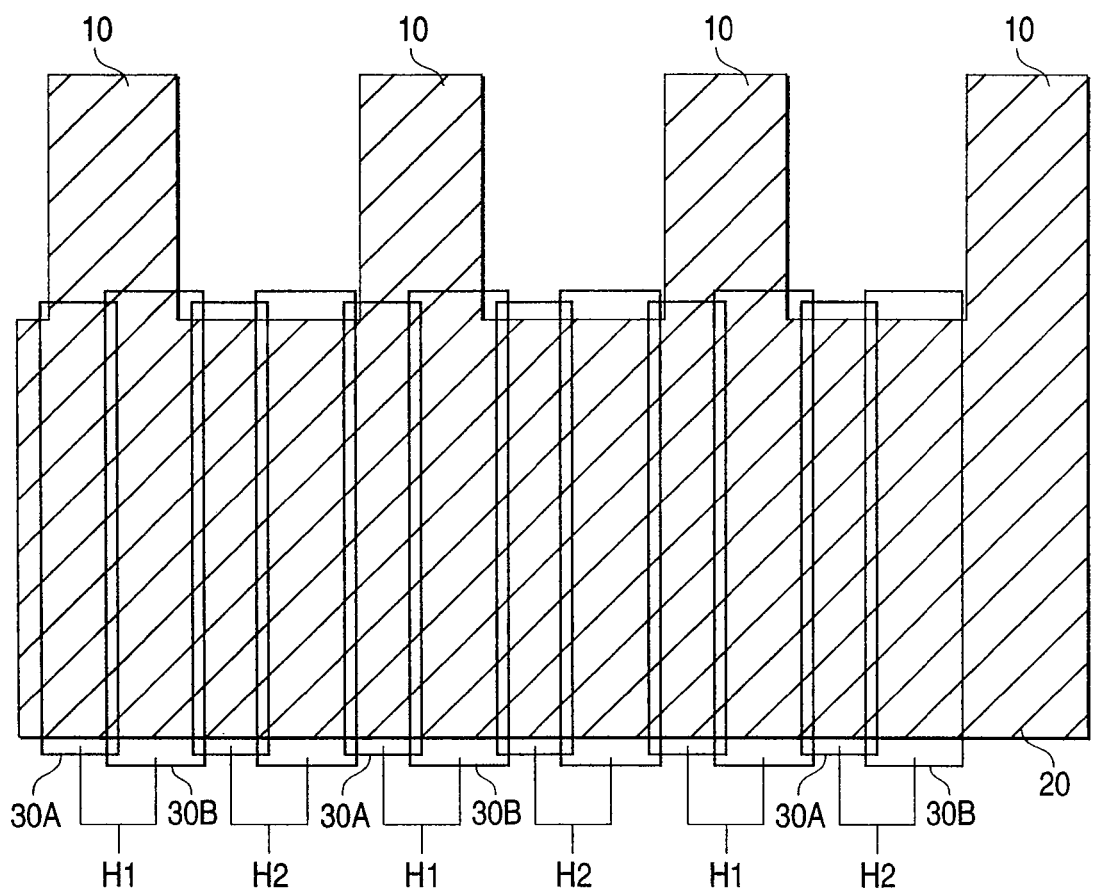
PRIOR ART  FIG. 1B
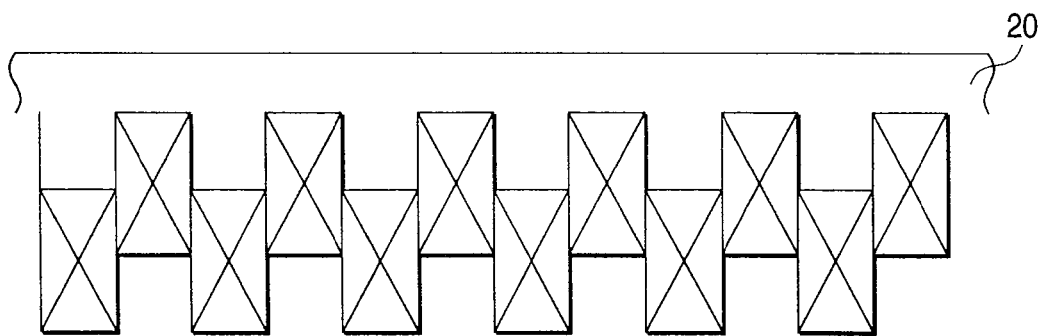

$H12 = H11 - \alpha$
$H14 = H13 - \alpha$
$H16 = H15 - \alpha$
$H18 = H16 - \alpha$ $H12 = H11 - \alpha'$
$H13 = H12 - \beta'$
$H14 = H13 - \gamma'$
$H16 = H15 - \alpha'$
$H17 = H16 - \beta'$
$H18 = H17 - \gamma'$

CCD IMAGING DEVICE AND DRIVING METHOD THEREOF

CROSS REFERENCE TO RELATED APPLICATIONS

The present application is a continuation of and claims priority to U.S. application Ser. No. 10/060,544, filed Jan. 30, 2002, now U.S. Pat No. 6,970,197, and also claims priority to Japanese Application No. P2001-029020, filed Feb. 6, 2001, which applications are incorporated herein by reference to the extent permitted by law.

BACKGROUND OF THE INVENTION

1. Field of the Invention

The present invention relates to a solid-state imaging device having a plurality of photodetecting portions that are arranged two-dimensionally and vertical CCD registers and a horizontal CCD register(s) for transferring signal charges that are output from the photodetecting portions, as well as to a driving method of such a solid-state imaging device.

2. Description of the Related Art

Among conventional CCD imaging devices of the above kind is known one having a horizontal CCD register shown in FIGS. 1A and 1B and FIGS. 2A-2E.

In the CCD imaging device shown in FIG. 1A, one horizontal CCD register 20 is provided for a plurality of vertical CCD registers 10 on the horizontal CCD register 20. Two-layer transfer electrodes 30A and 30B are provided in two pairs for each vertical CCD register 10 on the horizontal CCD register 20. Two-phase horizontal drive pulse signals H1 and H2 having opposite polarities are applied alternately to the pairs of transfer electrodes 30A and 30B.

As shown in FIG. 1B, the charge transfer region of the horizontal CCD register 20 is so formed as to have prescribed potential differences that correspond to the respective transfer electrodes 30A and 30B.

Therefore, by applying the horizontal drive pulse signals H1 and H2 to the transfer electrodes 30A and 30B corresponding to each pair of vertical CCD registers 10 adjacent to each other as shown in FIGS. 2A and 2E, a signal charge transfer operation is performed in such a manner that the potentials of the charge transfer region of the horizontal CCD register 20 are controlled sequentially as shown in FIGS. 2B-2D.

That is, a two-phase-drive CCD, in which phase control can be performed relatively easily, is employed as the horizontal CCD register 20 that transfers signal charges at high speed.

FIGS. 3A-3F show another conventional CCD imaging device in which two horizontal CCD registers are provided for a plurality of vertical CCD registers.

Specifically, in the CCD imaging device shown in FIG. 3A, two horizontal CCD registers 50 and 60 are provided for a plurality of vertical CCD registers 40. The two horizontal CCD registers 50 and 60 share handling of signal charges that are output from the respective vertical CCD registers 40 and perform transfer operations parallel. Signal charges that are transferred by the horizontal CCD registers 50 and 60 are output to a charge detecting section (not shown) via a final gate section 70.

Also in this CCD imaging device, in each of the horizontal CCD registers 50 and 60, two-layer transfer electrodes 80A and 80B are provided in two pairs for each vertical CCD register 40. Two-phase horizontal drive pulse signals H1 and H2 having opposite polarities are applied alternately to the pairs of transfer electrodes 80A and 80B. Signal charges are transferred by the same operation as in the CCD imaging device of FIG. 1A and merge together in the final gate section 70.

Incidentally, in image sensors using the above conventional CCD imaging devices, the signal output rate should be increased as the number of pixels increases if the number of frames per unit time is kept constant. Actually, however, the output rate can not necessarily be increased easily when other factors such as the power consumption are taken into consideration.

On the other hand, when the output rate is not increased, the number of frames per unit time should necessarily be decreased, which means decrease in the amount of information relating to motion.

In still cameras, for example, it is necessary to bring the camera into focus and determine exposure by monitoring images in addition to take images to be recorded actually. For merely monitoring images, it is more important to secure a sufficient number of frames per unit time than obtaining high-resolution images.

In view of the above, a conventional technique is employed that the number of pixels used is decreased by decimating pixels and the number of images per unit time is thereby increased.

Among methods for decimating pixels are a method that read operations themselves on the photodetecting portions are decimated and a method that the number of signal charge packets is decreased by mixing signal charges adjacent to each other.

Pixels can be decimated in the vertical direction by prohibiting reading from part of the photodetecting portions through control by the read gate. However, it is difficult to perform reading for only arbitrary pixels in the horizontal direction because the electrodes are arranged continuously in the horizontal direction.

Therefore, in the horizontal direction, the method that signal charges are mixed with each other remains a candidate. However, the number of transfer stages is fixed in ordinary structure horizontal CCD registers as shown in FIG. 1A. This results in a problem that the drive frequency cannot be decreased in accordance with a decreased number of signal charge packets and hence the frame rate cannot be increased.

SUMMARY OF THE INVENTION

The present invention has been made in view of the above circumstances in the art, and an object of the invention is therefore to provide a CCD imaging device capable of outputting, in a horizontal CCD register, signal charges that are consecutive in the horizontal direction while mixing desired signal charges and hence capable of increasing the frame rate without increasing the drive frequency, as well as a driving method of such a CCD imaging device.

The invention provides a CCD imaging device comprising a plurality of photodetecting portions that are arranged two-dimensionally; a plurality of vertical CCD registers for transferring, in a vertical direction, signal charges that are output from the respective photodetecting portions; and a single horizontal CCD register for transferring, in a horizontal transfer direction, signal charges that have been transferred by the vertical CCD registers, the horizontal CCD register having horizontal transfer electrodes in such a manner that four transfer electrodes that are provided so as to correspond to each of the vertical CCD registers are independent of each other electrically.

In this imaging device having the single horizontal CCD register, the horizontal CCD register has horizontal transfer electrodes in such a manner that four transfer electrodes that are provided so as to correspond to each vertical CCD register are independent of each other electrically. Therefore, the horizontal transfer of signal charges can be performed by driving the four transfer electrodes independently by arbitrary horizontal transfer pulse signals.

Further, by controlling horizontal transfer pulse signals in the same manner as in the conventional method, the conventional two-phase driving or the like can be realized, that is, an ordinary operation can also be performed.

The invention also provides a CCD imaging device comprising a plurality of photodetecting portions that are arranged two-dimensionally; a plurality of vertical CCD registers for transferring, in a vertical direction, signal charges that are output from the respective photodetecting portions; and m horizontal CCD registers for transferring, in a horizontal transfer direction, signal charges that have been transferred by the vertical CCD registers, the m horizontal CCD registers having horizontal transfer electrodes in such a manner that all of transfer electrodes that are provided so as to correspond to each of the vertical CCD registers are independent of each other electrically.

In this imaging device having the m horizontal CCD registers, the m horizontal CCD registers have horizontal transfer electrodes in such a manner that all of transfer electrodes that are provided so as to correspond to each vertical CCD register are independent of each other electrically. Therefore, the horizontal transfer of signal charges can be performed by driving the transfer electrodes independently by arbitrary horizontal transfer pulse signals.

Further, by controlling horizontal transfer pulse signals in the same manner as in the conventional method, the conventional two-phase driving or the like can be realized, that is, an ordinary operation can also be performed.

The invention provides a driving method of a CCD imaging device comprising a plurality of photodetecting portions that are arranged two-dimensionally, a plurality of vertical CCD registers for transferring, in a vertical direction, signal charges that are output from the respective photodetecting portions, and a single horizontal CCD register for transferring, in a horizontal transfer direction, signal charges that have been transferred by the vertical CCD registers, wherein the horizontal CCD register has horizontal transfer electrodes in such a manner that four transfer electrodes that are provided so as to correspond to each of the vertical CCD registers are independent of each other electrically; and wherein the four transfer electrodes are driven by independent drive pulse signals.

In this driving method of the CCD imaging device having the single horizontal CCD register, the horizontal CCD register has horizontal transfer electrodes in such a manner that four transfer electrodes that are provided so as to correspond to each of the vertical CCD registers are independent of each other electrically, and the horizontal transfer of signal charges is performed by driving the four transfer electrodes independently by arbitrary horizontal transfer pulse signals.

Further, by controlling horizontal transfer pulse signals in the same manner as in the conventional method, the conventional two-phase driving or the like can be realized, that is, an ordinary operation can also be performed.

The invention also provides a driving method of a CCD imaging device comprising a plurality of photodetecting portions that are arranged two-dimensionally, a plurality of vertical CCD registers for transferring, in a vertical direction, signal charges that are output from the respective photodetecting portions, and m horizontal CCD registers for transferring, in a horizontal transfer direction, signal charges that have been transferred by the vertical CCD registers, wherein the m horizontal CCD registers have horizontal transfer electrodes in such a manner that all of transfer electrodes that are provided so as to correspond to each of the vertical CCD registers are independent of each other electrically; and wherein the transfer electrodes corresponding to each of the vertical CCD registers are driven by independent drive pulse signals.

In this driving method of the CCD imaging device having the m horizontal CCD registers, the m horizontal CCD register have horizontal transfer electrodes in such a manner that all of transfer electrodes that are provided so as to correspond to each of the vertical CCD registers are independent of each other electrically, and the horizontal transfer of signal charges is performed by driving the transfer electrodes independently by arbitrary horizontal transfer pulse signals.

Further, by controlling horizontal transfer pulse signals in the same manner as in the conventional method, the conventional two-phase driving or the like can be realized, that is, an ordinary operation can also be performed.

BRIEF DESCRIPTION OF THE DRAWINGS

FIGS. 1A and 1B are a schematic plan view and a potential diagram of a horizontal CCD register of a conventional CCD imaging device;

DESCRIPTION OF THE PREFERRED EMBODIMENTS

CCD imaging devices and driving methods thereof according to embodiments of the present invention will be hereinafter described.

Preferred embodiments will be described below. Although the embodiments will include various technically preferable limitations, the scope of the invention is not restricted to those limitations unless a statement to the contrary is made.

Figure 2:
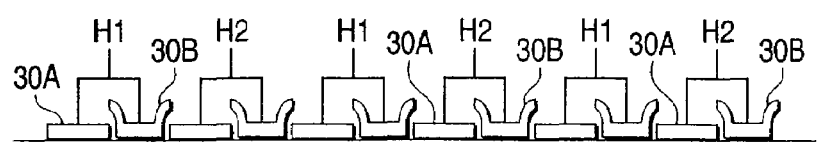
FIGS. 2A-2E are explanatory diagrams showing a driving method of the conventional CCD imaging device of FIGS. 1A and 1B.
Figure 2:
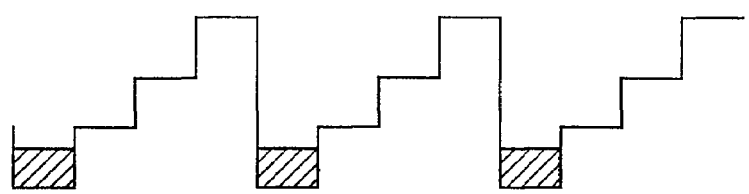
Figure 2:
Figure 2:
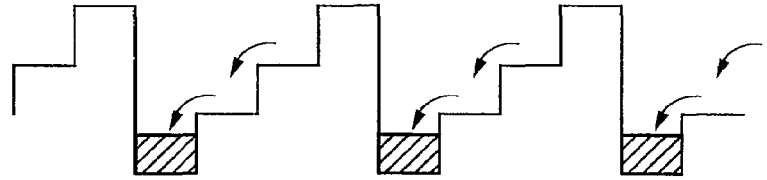
Figure 2:
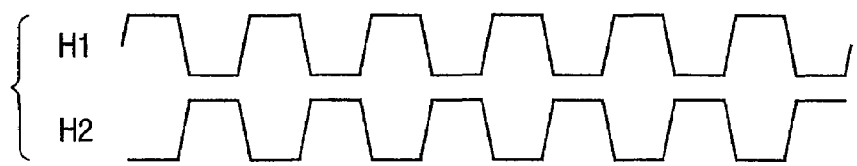
Figure 3:
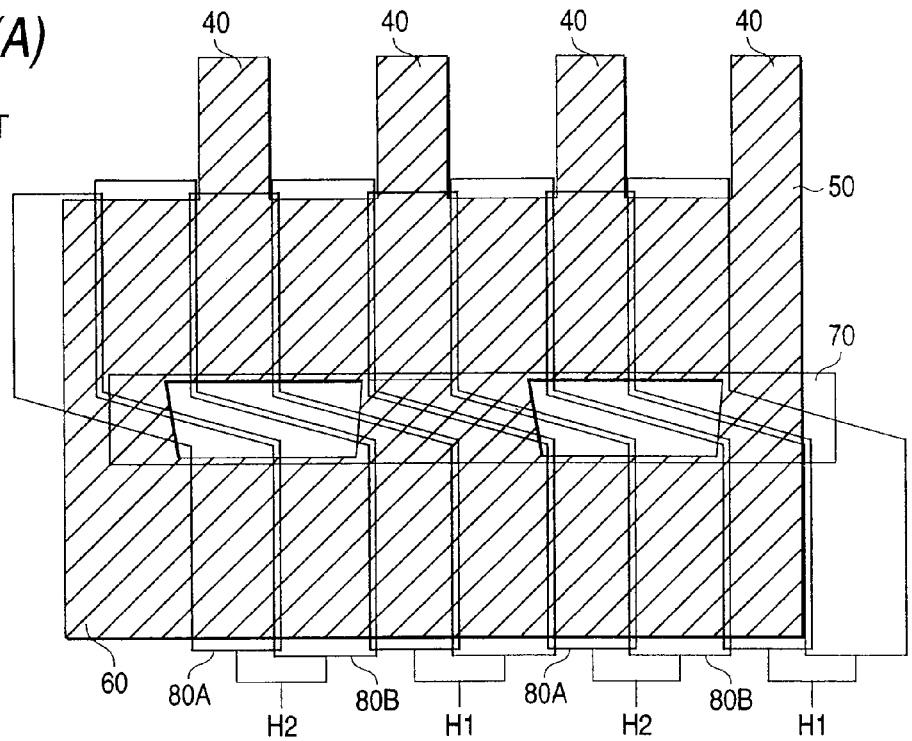
FIGS. 3A-3F are a schematic plan view and explanatory diagrams showing a horizontal CCD register of another conventional CCD imaging device and a driving method thereof.
Figure 3:
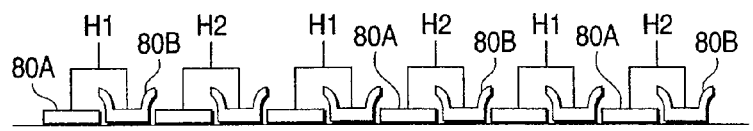
Figure 3:
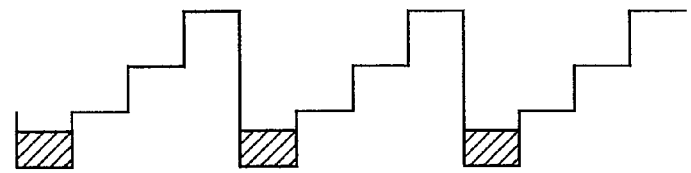
Figure 3:
Figure 3:
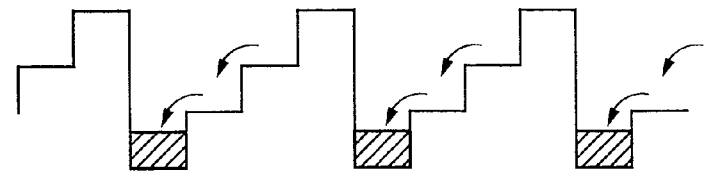
Figure 3:
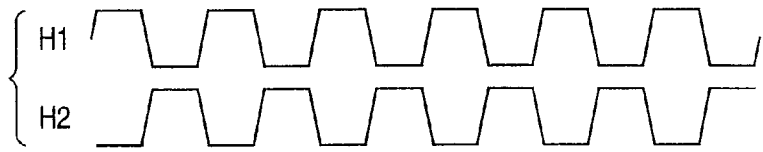
Figure 4:
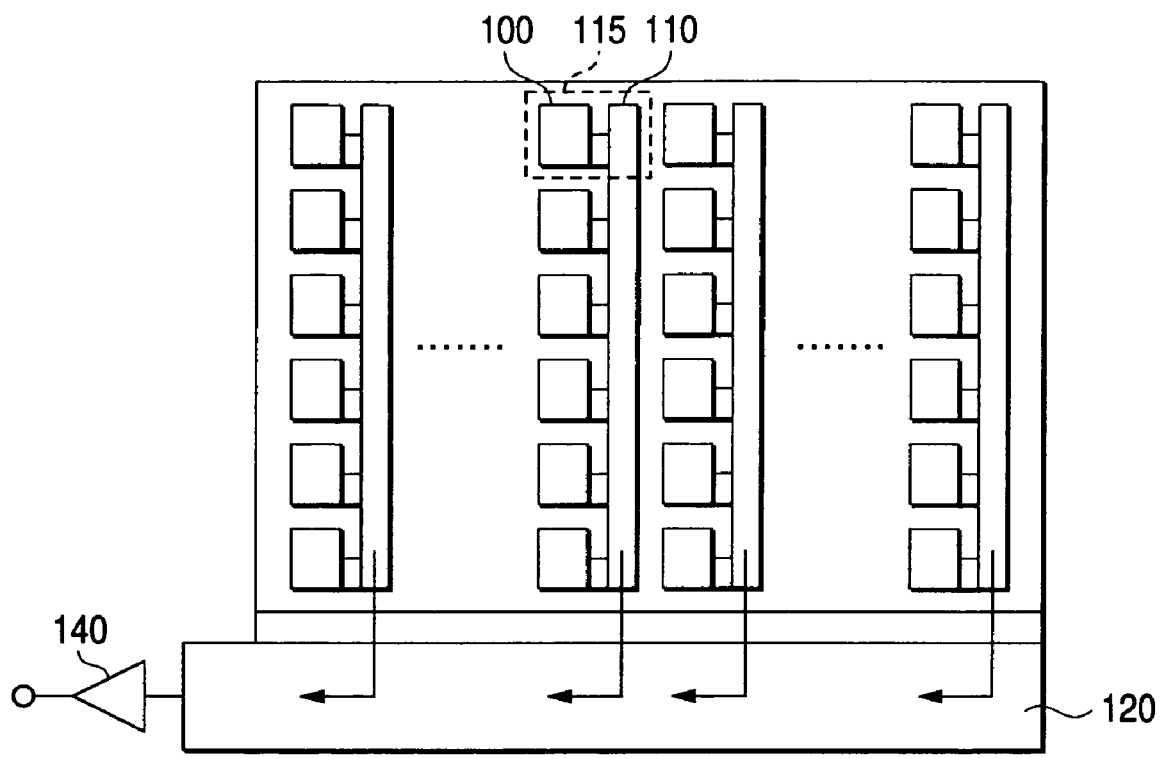
FIG. 4 is a schematic plan view of an interline transfer CCD imaging device according to a first embodiment of the invention.

FIG. 4 shows an interline transfer (IT) CCD imaging device according to a first embodiment of the invention. As shown in FIG. 4, a plurality of photodetecting portions 100 each for converting incident light into a signal charge of an amount corresponding to the quantity of the incident light are arranged two-dimensionally. A vertical CCD register 110 is provided for each vertical column of photodetecting portions 100. Reference numeral 115 denotes a unit cell. Signal charges that have been read from photodetecting portions 100 are transferred in order in the vertical direction while being shifted in part of each horizontal blanking period.

Signal charges that have been transferred in the vertical direction by the vertical CCD registers 110 are moved to a horizontal CCD register 120 in order line by line. The horizontal CCD register 120 transfers one-line signal charges in order in the horizontal direction in a horizontal scanning period that follows each horizontal blanking period. The signal charges that have been transferred in the horizontal direction by the horizontal CCD register 120 are converted into signal voltages at the transfer destination end and then output via an output section 108 that is a source follower circuit or the like.

Figure 5:
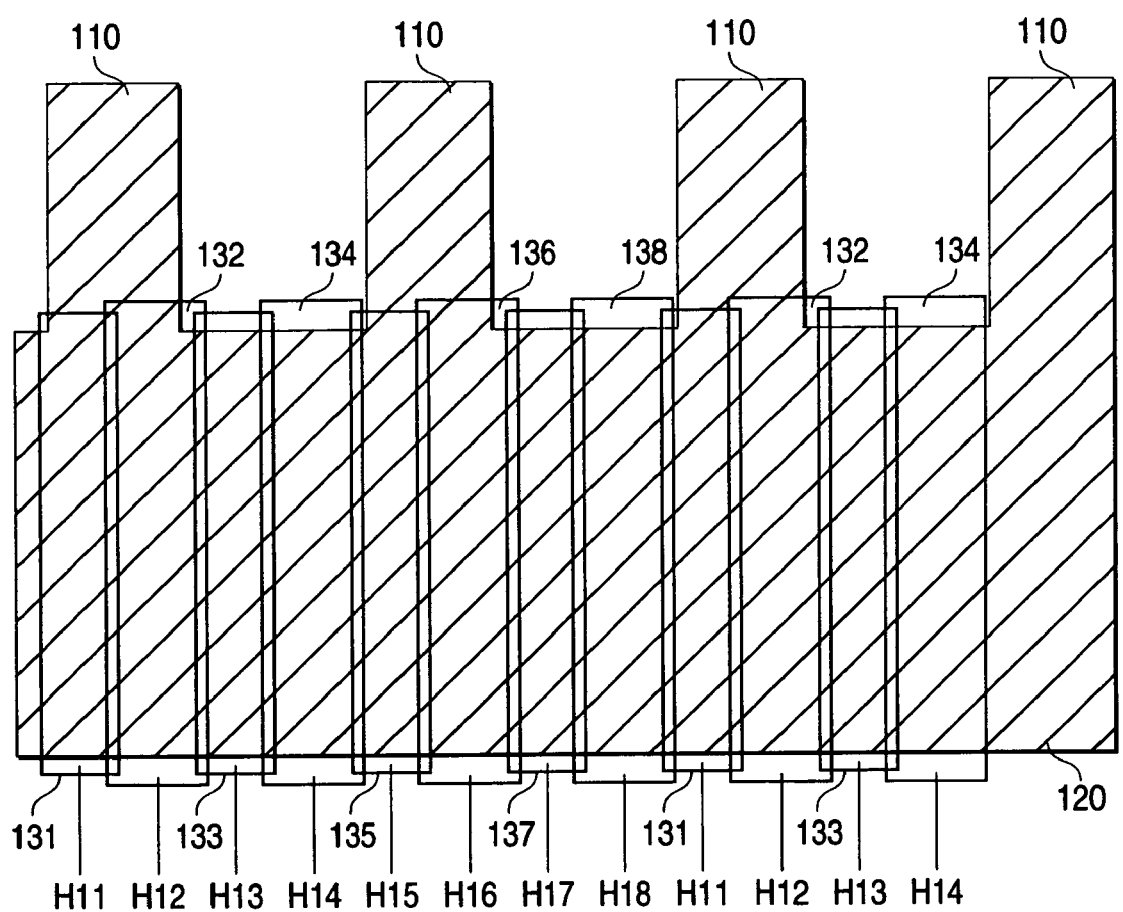
FIG. 5 is a schematic plan view of a horizontal CCD register of the CCD imaging device of FIG. 4.

FIG. 5 is a schematic plan view of a horizontal CCD register of the CCD imaging device of FIG. 4.

In the CCD imaging device of FIG. 4, the one horizontal CCD register 120 is provided for a plurality of vertical CCD registers 110. In the horizontal CCD register 120, eight horizontal transfer electrodes 131-138 that are independent of each other electrically are provided for each pair of vertical CCD registers 110 adjacent to each other. Eight kinds of horizontal pulse signals H11-H18 are applied to the respective transfer electrodes 131-138.

In this embodiment, by controlling the respective horizontal transfer pulse signals H11-H18 in a driving method as described below, an operation that the horizontal CCD register 120 consecutively outputs consecutive signal charges in the same manner as in the conventional two-phase driving method and an operation that the horizontal CCD register 120 outputs consecutive signal charges while mixing desired ones can be performed selectively.

Next, a driving method of the above CCD imaging device will be described.

FIGS. 6A-6E show an exemplary operation of the above CCD imaging device that signal charges are output consecutively in the same manner as in the conventional two-phase driving method.

Most of the conventional horizontal CCD registers employ the two-phase driving method in which the phases can be managed relatively easily. As described in the above conventional example (see FIGS. 1A and 1B), each pair of transfer electrodes adjacent to each other to which the same driving pulse signal is applied have a prescribed potential difference.

In the horizontal CCD register 120 of this embodiment, among the eight horizontal transfer pulse signals H11-H18, two that are applied to each pair of transfer electrodes adjacent to each other are given a voltage difference, whereby a horizontal transfer operation can be obtained that behaves as if it were the horizontal transfer operation of the conventional two-phase driving method.

Figure 6:
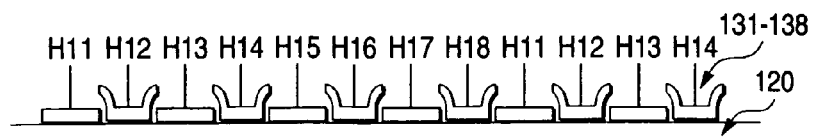
FIGS. 6A-6E show an exemplary operation in a case that the CCD imaging device of FIG. 4 outputs signal charges consecutively in the same manner as in a conventional two-phase driving method.
Figure 6:
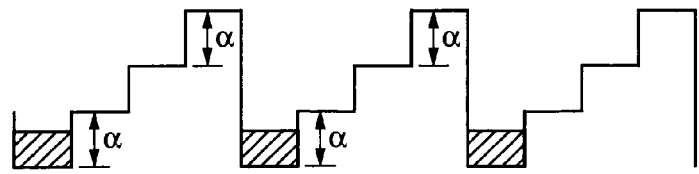
Figure 6:
Figure 6:
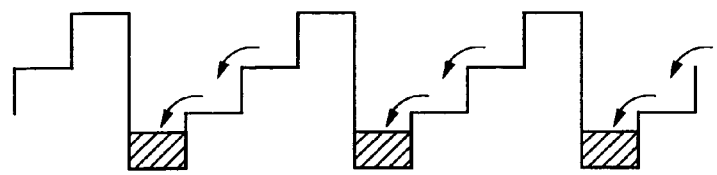
Figure 6:
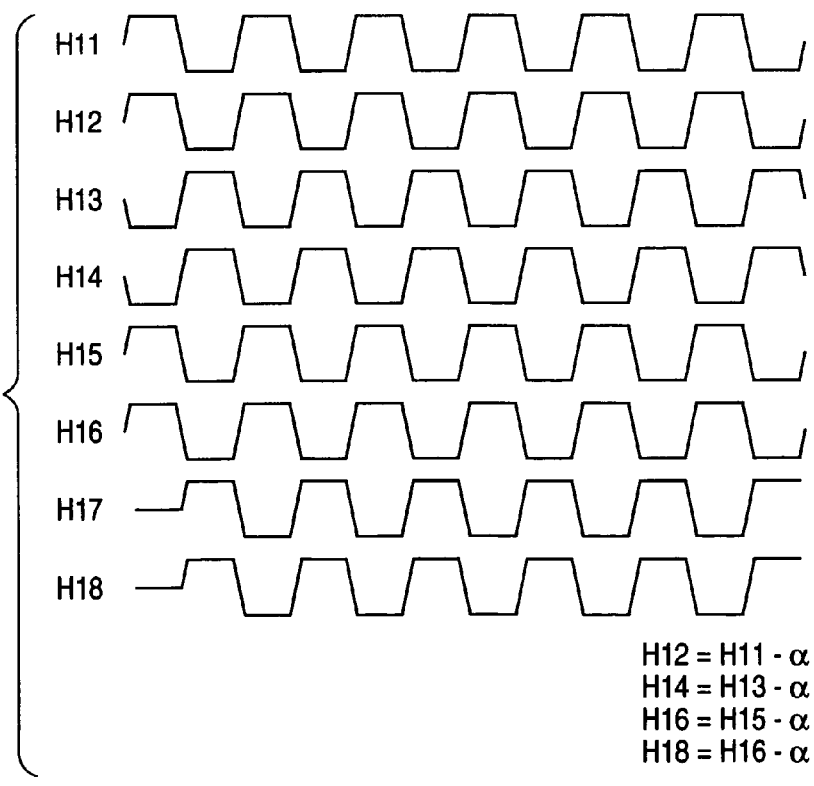

More specifically, as shown in FIG. 6E two pairs of horizontal transfer pulse signals H11, H12, H15, and H16 are in phase. The other two pairs of horizontal transfer pulse signals H13, H14, H17, and H18 are in phase and are opposite in polarity to the horizontal transfer pulse signals H11, H12, H15, and H16. A voltage difference a is provided between the even-numbered horizontal transfer pulse signals H12, H14, H16, and H18 and the odd-numbered horizontal transfer pulse signals H11, H13, H15, and H17, respectively.

Signal charges are transferred by controlling the potential of the charge transfer region of the horizontal CCD register 120 in order as shown in FIGS. 6B-6D by applying such horizontal transfer pulse signals H11-H18 to the respective transfer electrodes 131-138. In this manner, the horizontal CCD register 120 can be used completely in the same manner as the conventional two-phase horizontal CCD register.

Figure 7:
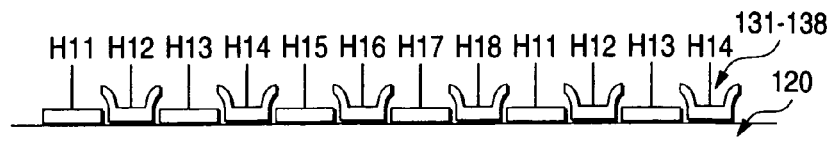
FIGS. 7A-7C show a first exemplary operation in a case that the CCD imaging device of FIG. 4 outputs signal charges that are arranged in the horizontal direction while mixing desired ones.
Figure 7:
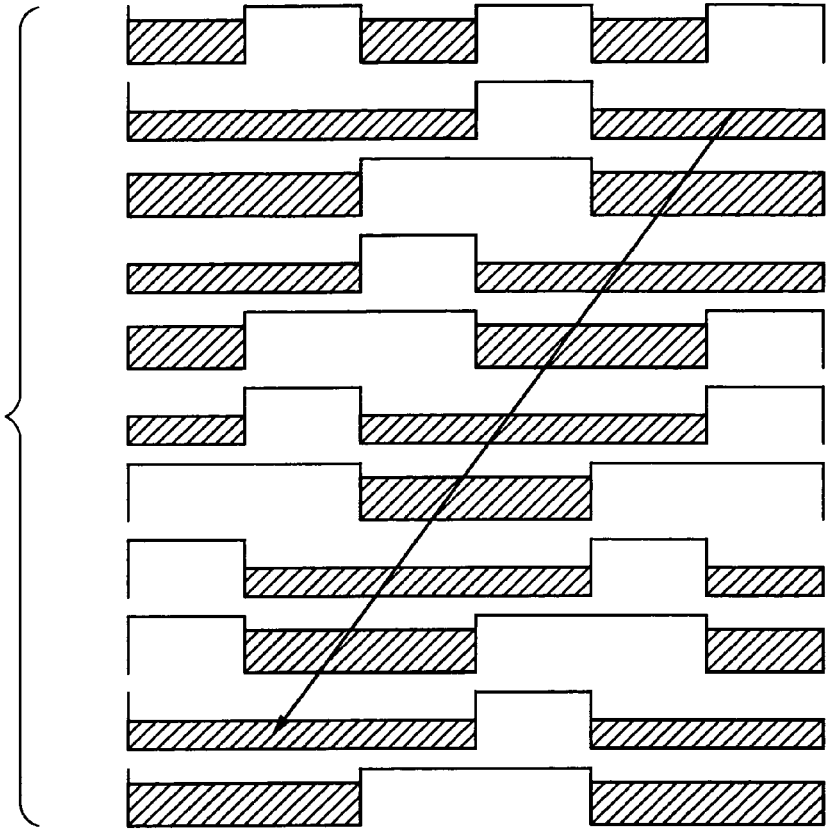
Figure 7:
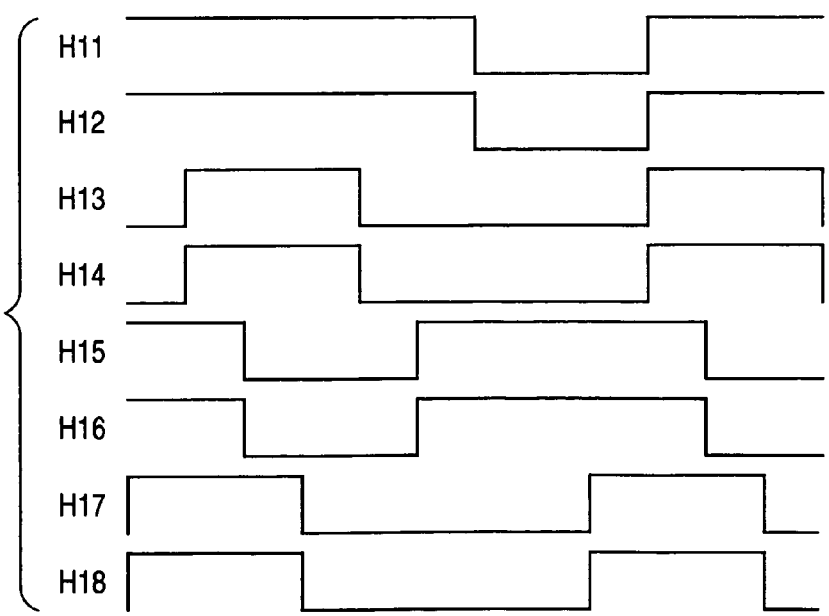

FIGS. 7A-7C show a first exemplary operation of the case that the CCD imaging device outputs signal charges arranged in the horizontal direction while mixing desired ones.

Two transfer electrodes adjacent to each other are considered a pair and the eight transfer electrodes 131-138 are driven in four phases. The horizontal transfer pulse signals H11 to H18 are controlled as to have phase relationships shown in FIG. 7C.

This makes it possible to mix two charge packets that are consecutive in the horizontal direction as shown in FIG. 7B.

Each pair of transfer electrodes adjacent to each other may be supplied with the same voltage. However, it is desirable that each pair of transfer electrodes be given a small voltage difference so as to produce a transfer electric field in the charge transfer direction.

It is also possible to form a potential difference between each pair of transfer electrodes by impurity doping in advance as in the case of the two-phase CCD. The potential difference should be smaller than a half of the amplitude of drive pulses.

Figure 8:
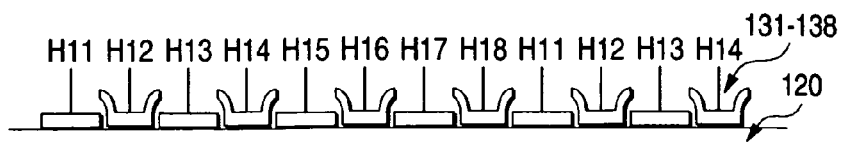
FIGS. 8A-8C show a second exemplary operation in the case that the CCD imaging device of FIG. 4 outputs signal charges that are arranged in the horizontal direction while mixing desired ones.
Figure 8:
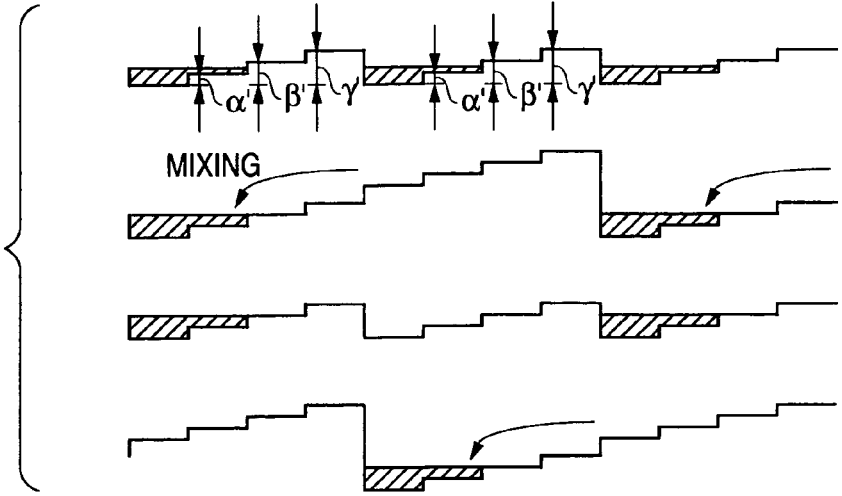
Figure 8:
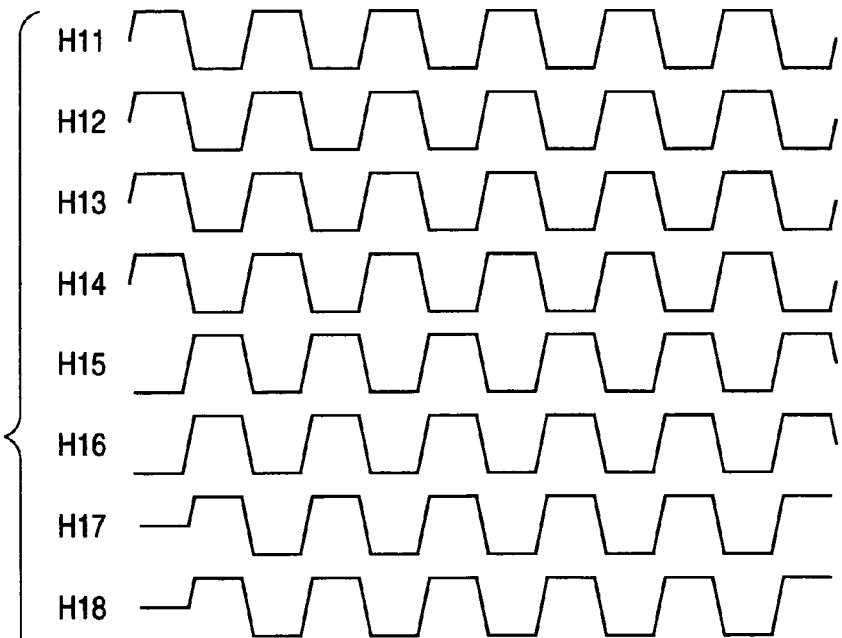

FIGS. 8A-8C show a second exemplary operation of the case that the CCD imaging device outputs signal charges arranged in the horizontal direction while mixing desired ones.

Four transfer electrodes adjacent to each other are considered a set and the eight transfer electrodes 131-138 are driven in two phases. As shown in the bottom part of FIG. 8C, voltage differences $\alpha'$, $\beta'$, $\gamma'$ are provided between two, applied to two respective transfer electrodes adjacent to each other, of the horizontal transfer pulse signals H11-H18.

This makes it possible to transfer four charge packets that are consecutive in the horizontal direction in such a manner that they are mixed with each other as shown in FIG. 8B.

In the driving methods of FIGS. 7A-7C and FIGS. 8A-8C, the number of signal charge packets is halved by the mixing of signal charges adjacent to each other and the number of stages of the horizontal CCD register is also halved. Therefore, with the same drive frequency, the time necessary for transfer of all charged can be halved and the frame rate can be doubled.

The above description is directed to the case of mixing charges that are output from two vertical CCD registers 110 adjacent to each other. The invention can be practiced in a similar manner even in the case of mixing charges that are output from three or more vertical CCD registers 110 adjacent to each other.

Figure 9:
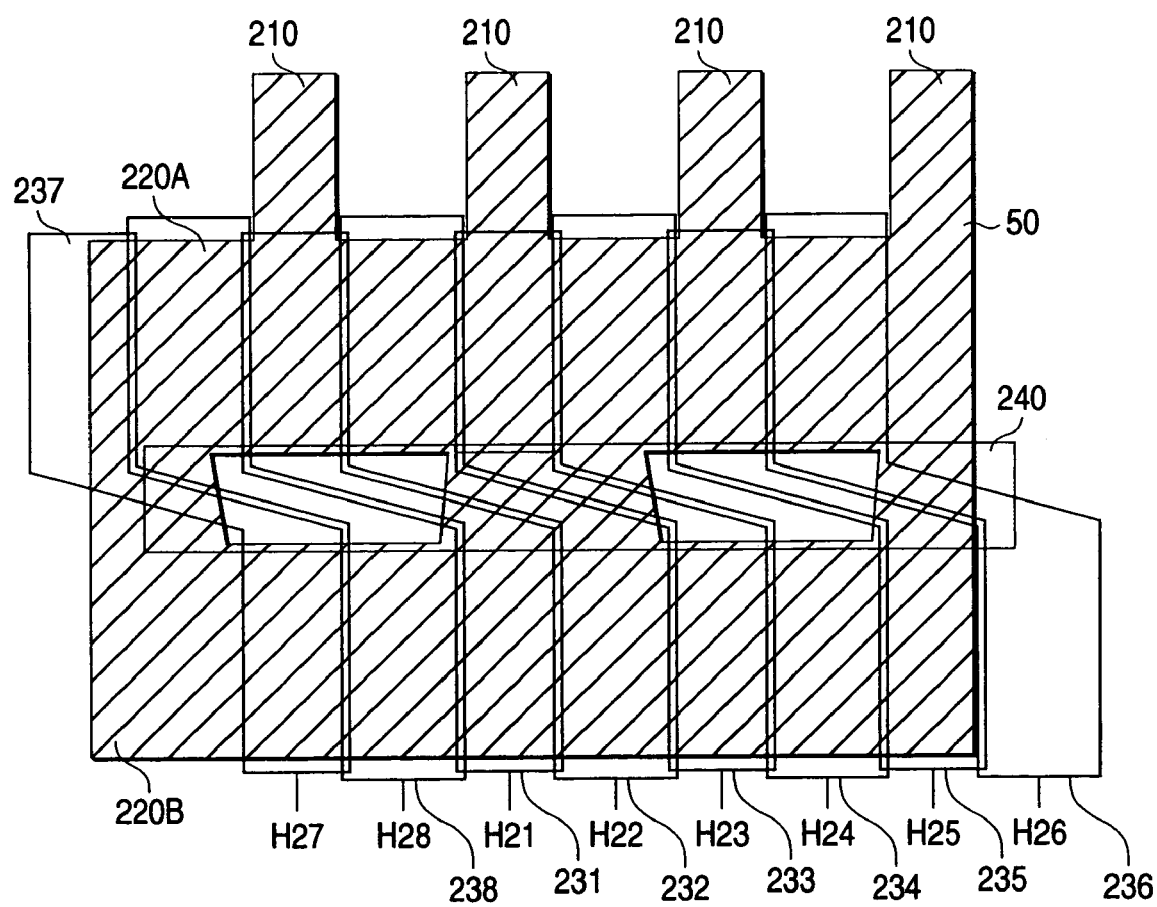
FIG. 9 is a schematic plan view of a horizontal CCD register of a CCD imaging device according to a second embodiment of the invention.

FIG. 9 is a schematic plan view of a horizontal CCD register of a CCD imaging device according to a second embodiment of the invention.

In this CCD imaging device, two horizontal CCD registers 220A and 220B are provided for a plurality of vertical CCD registers 210. The two horizontal CCD registers 220A and 220B alternately handle signal charges that are output from each pair of vertical CCD registers 210 adjacent to each other and transfer signal charges parallel. The signal charges are output from a final gate section 240 to a charge detecting section.

The two horizontal CCD registers 220A and 220B have eight horizontal transfer electrodes 231-238 that are independent of each other electrically. Eight kinds of horizontal transfer pulse signals H21-H28 are applied to the respective transfer electrodes 231-238.

Also with this configuration, it is possible to output consecutive signal charges while mixing desired ones by the same control as shown in FIGS. 7A-7C or 8A-8C.

The number of horizontal CCD registers is not limited to two. The invention can also be applied to a case that the number of horizontal CCD registers is three or more.

As described above, in the imaging device according to a first aspect of the invention having a single horizontal CCD register, the horizontal CCD register has horizontal transfer electrodes in such a manner that four transfer electrodes that are provided so as to correspond to each vertical CCD register are independent of each other electrically.

Therefore, the horizontal transfer of signal charges can be performed by driving the four transfer electrodes independently by arbitrary horizontal transfer pulse signals. This makes it possible to output signal charges that are arranged consecutively in the horizontal direction while mixing desired ones together as well as to increase the frame rate without increasing the drive frequency.

Further, by controlling horizontal transfer pulse signals in the same manner as in the conventional method, the conventional two-phase driving or the like can be realized, that is, an ordinary operation can also be performed.

In the imaging device according to a second aspect of the invention having m horizontal CCD registers, the m horizontal CCD registers have horizontal transfer electrodes in such a manner that all of transfer electrodes that are provided so as to correspond to each vertical CCD register are independent of each other electrically.

Therefore, the horizontal transfer of signal charges can be performed by driving the transfer electrodes independently by arbitrary horizontal transfer pulse signals. This makes it possible to output signal charges that are arranged consecutively in the horizontal direction while mixing desired ones together as well as to increase the frame rate without increasing the drive frequency.

Further, by controlling horizontal transfer pulse signals in the same manner as in the conventional method, the conventional two-phase driving or the like can be realized, that is, an ordinary operation can also be performed.

In the driving method, according to the first aspect of the invention, of a CCD imaging device having a single horizontal CCD register, the horizontal CCD register has horizontal transfer electrodes in such a manner that four transfer electrodes that are provided so as to correspond to each of the vertical CCD registers are independent of each other electrically, and the four transfer electrodes are driven by independent drive pulse signals.

Therefore, the horizontal transfer of signal charges can be performed by driving the four transfer electrodes independently by arbitrary horizontal transfer pulse signals. This makes it possible to output signal charges that are arranged consecutively in the horizontal direction while mixing desired ones together as well as to increase the frame rate without increasing the drive frequency.

Further, by controlling horizontal transfer pulse signals in the same manner as in the conventional method, the conventional two-phase driving or the like can be realized, that is, an ordinary operation can also be performed.

In the driving method, according to the second aspect of the invention, of a CCD imaging device having m horizontal CCD registers, the m horizontal CCD register have horizontal transfer electrodes in such a manner that all of transfer electrodes that are provided so as to correspond to each of the vertical CCD registers are independent of each other electrically, and the transfer electrodes driven by independent drive pulse signals.

Therefore, by driving the transfer electrodes independently by arbitrary horizontal transfer pulse signals, signal charges that are arranged consecutively in the horizontal direction can be output while desired ones are mixed together. The frame rate can be increased without increasing the drive frequency.

Further, by controlling horizontal transfer pulse signals in the same manner as in the conventional method, the conventional two-phase driving or the like can be realized, that is, an ordinary operation can also be performed.

The invention claimed is:

1. A CCD imaging device comprising:
   a plurality of photo-detecting portions that are arranged two-dimensionally;
   a plurality of vertical CCD registers to transfer, in a vertical direction, signal charges that are output from the respective photo-detecting portions; and
   m horizontal CCD registers to transfer, in a horizontal transfer direction, signal charges that are output from the respective photo-detecting portions, and m horizontal CCD registers to transfer, in a horizontal transfer direction, signal charges that have been transferred by the vertical CCD registers,
   wherein the m horizontal CCD registers has horizontal transfer electrodes such that a plurality of electrodes correspond to each of the vertical CCD registers, and a predetermined number of electrodes which are placed consecutively and more than the plurality of electrodes that are provided so as to correspond to each of the vertical CCD registers are all independent of each other electrically and connected to different driving pulse lines.

2. The CCD imaging device according to claim 1, wherein the transfer electrodes that are independent of each other electrically are divided into pairs of transfer electrodes, and wherein each pair of transfer electrodes are driven in phase in a state that they are given a prescribed voltage difference in such a manner that the potential becomes deeper in the horizontal transfer direction.

3. The CCD imaging device according to claim 2, wherein transfer electrodes of the m horizontal CCD registers that correspond to each set of n vertical CCD registers adjacent to each other can be driven independently of each other electrically, where n is greater than or equal to 2.

4. A driving method of a CCD imaging device including a plurality of photo-detecting portions that are arranged two-dimensionally, a plurality of vertical CCD registers to transfer, in a vertical direction, signal charges that are output from the respective photo-detecting portions, and m horizontal CCD registers to transfer, in a horizontal transfer direction, signal charges that have been transferred by the vertical CCD registers, the method comprising:
   providing horizontal transfer electrodes via the m horizontal CCD registers such that a plurality of electrodes correspond to each of the vertical CCD registers, and a predetermined number of electrodes which are placed consecutively and more than the plurality of electrodes that are provided so as to correspond to each of the vertical CCD registers are all independent of each other electrically and are driven by independent drive pulse signals.

5. The driving method according to claim 4, wherein the transfer electrodes that are independent of each other electrically are divided into pairs of transfer electrodes, and wherein each pair of transfer electrodes are driven in phase in a state that they are given a prescribed voltage difference in such a manner that the potential becomes deeper in the horizontal transfer direction.

6. The driving method according to claim 5, wherein transfer electrodes of the m horizontal CCD registers that correspond to each set of n vertical CCD registers adjacent to each other can be driven independently of each other electrically, where n is greater than or equal to 2.

7. A CCD imaging device comprising:
a plurality of photo-detecting portions that are arranged two-dimensionally;
a plurality of vertical CCD registers to transfer, in a vertical direction, signal charges that are output from the respective photo-detecting portions; and
a horizontal CCD register to transfer, in a horizontal transfer direction, signal charges that have been transferred by the vertical CCD registers,
wherein the horizontal CCD register has horizontal transfer electrodes such that a plurality of electrodes correspond to each of the vertical CCD registers, and a predetermined number of electrodes which are placed consecutively and more than the plurality of electrodes that are provided so as to correspond to each of the vertical CCD registers are all independent of each other electrically and each of the vertical CCD registers are connected to different driving pulse lines.

8. The CCD imaging device according to claim 7, wherein the vertical CCD registers are connected to four different driving pulse lines.

9. The CCD imaging device according to claim 7, wherein pairs of the plurality of electrodes are impurity doped to form a potential difference between each of the pairs of the plurality of electrodes.

10. A driving method of a CCD imaging device including a plurality of photo-detecting portions that are arranged two-dimensionally, a plurality of vertical CCD registers to transfer, in a vertical direction, signal charges that are output from the respective photo-detecting portions, and horizontal CCD register to transfer, in a horizontal transfer direction, signal charges that have been transferred by the vertical CCD registers, the method comprising:
providing horizontal transfer electrodes via the horizontal CCD register such that a plurality of electrodes correspond to each of the vertical CCD registers;
driving a predetermined number of electrodes by independent drive pulse signals, the predetermined number of electrodes placed consecutively and more than the plurality of electrodes that are provided so as to correspond to each of the vertical CCD registers are all independent of each other electrically; and
producing a transfer electric field in a charge transfer direction via voltage differences between pairs of transfer electrodes.

11. The driving method of the CCD imaging device according to claim 10, further comprising:
mixing first output signals arranged consecutively in a horizontal direction with second output signals different from the first output signals such that frame rate is increased and drive frequency is unaltered.

12. The driving method of the CCD imaging device according to claim 10, further comprising:
impurity doping the pairs of transfer electrodes to form a potential difference between each of the pairs of transfer electrodes.

13. The driving method of the CCD imaging device according to claim 12, wherein the potential difference is smaller than half of an amplitude of the drive pulse signals.

14. The driving method of the CCD imaging device according to claim 10, wherein the predetermined number of electrodes are driven in four phases.

* * * * *